(12) United States Patent
Myny

(10) Patent No.: US 10,637,477 B2
(45) Date of Patent: Apr. 28, 2020

(54) LOW POWER LOGIC CIRCUIT

(71) Applicant: IMEC VZW, Leuven (BE)

(72) Inventor: Kris Myny, Heusden-Zolder (BE)

(73) Assignee: IMEC VZW, Leuven (BE)

( * ) Notice: Subject to any disclaimer, the term of this patent is extended or adjusted under 35 U.S.C. 154(b) by 0 days.

(21) Appl. No.: 16/450,046

(22) Filed: Jun. 24, 2019

(65) Prior Publication Data

US 2020/0007130 A1 Jan. 2, 2020

(30) Foreign Application Priority Data

Jun. 28, 2018 (EP) ..................................... 18180567

(51) Int. Cl.
*H03K 19/0944* (2006.01)
*H03K 19/017* (2006.01)
(52) U.S. Cl.
CPC ... *H03K 19/0944* (2013.01); *H03K 19/01721* (2013.01)
(58) Field of Classification Search
None
See application file for complete search history.

(56) References Cited

U.S. PATENT DOCUMENTS

| 4,999,523 A | 3/1991 | Cham et al. |
| 2008/0315918 A1 | 12/2008 | Luo et al. |
| 2010/0109708 A1* | 5/2010 | Koyama .......... H03K 19/09407 326/96 |
| 2011/0006810 A1* | 1/2011 | Nedalgi ............. H03K 19/0013 326/81 |
| 2014/0145919 A1* | 5/2014 | Qian .................... G09G 3/3225 345/82 |
| 2018/0152189 A1* | 5/2018 | Papadopoulos ...... H03K 19/094 |

FOREIGN PATENT DOCUMENTS

| EP | 2241009 A1 | 10/2010 |
| WO | 2009098626 A1 | 8/2009 |

OTHER PUBLICATIONS

European Search Report, European Patent Application No. 18180567. 2, dated Jan. 15, 2019, 5 pages.
Papadopoulos, Nikolas P. et al., "Low-Power Bootstrapped Rail-to-Rail Logic Gates for Thin-Film Applications", Journal of Display Technology, vol. 12, No. 12, Dec. 2016, pp. 1539-1546.

(Continued)

*Primary Examiner* — Seokjin Kim
(74) *Attorney, Agent, or Firm* — McDonnell Boehnen Hulbert & Berghoff LLP

(57) ABSTRACT

The disclosure relates to a logic circuit. The logic circuit comprises a first thin film transistor, TFT, having a gate connected to an input of the logic circuit, and a drain connected to an output of the logic circuit. The logic circuit further comprises a second TFT having a source connected to the output of the logic circuit. The logic circuit further comprises a third TFT having a gate connected to the input of the logic circuit, a source connected to the source of the second TFT, and a drain connected to a gate of the second TFT. The logic circuit further comprises a fourth TFT having a gate connected to the output of the logic circuit, and a source connected to the gate of the second TFT and the drain of the third TFT.

20 Claims, 2 Drawing Sheets

(56) References Cited

OTHER PUBLICATIONS

Huang, Tsung-Ching et al., "Pseudo-CMOS: A Design Style for Low-Cost and Robust Flexible Electronics", IEEE Transactions on Electron Devices, vol. 58, No. 1, Jan. 2011, pp. 141-150.

Myny, Kris et al., "Robust Digital Design in Organic Electronics by Dual-Gate Technology" ISSCC 2010/Session 7/ Designing in Emerging Technologies/7.4, 2010 IEEE International Solid-State Circuits Conference, Feb. 9, 2010, 3 pages.

Kim, Jong-Seok et al., "Dynamic Logic Circuits Using a-IGZO TFTs, IEEE Transactions on Electron Devices", vol. 64, No. 10, Oct. 2017, pp. 4123-4130.

Venturelli, Matteo et al., "Unipolar Differential Logic for Large-Scale Integration of Flexible aIGZO Circuits", IEEE Transactions on Circuits and Systems-II: Express Briefs, vol. 64, No. 5, May 2017, pp. 565-569.

* cited by examiner

LOW POWER LOGIC CIRCUIT

CROSS-REFERENCE TO RELATED APPLICATIONS

The present application is a non-provisional patent application claiming priority to European Patent Application No. 18180567.2, filed Jun. 28, 2018, the contents of which are hereby incorporated by reference.

FIELD OF THE DISCLOSURE

The present disclosure generally relates to logic circuits.

BACKGROUND

Circuits implemented with thin-film transistors (TFT) have been gaining in popularity over the last few years. It is thought that this is mainly due to an increase in performance presented by circuits implemented with TFTs and also a growing field of applications such as low-cost RFID/NFC tags, integrated scan drivers for displays and biomedical patches. Many thin-film circuits, such as tags and scan drivers, rely heavily on digital circuit blocks.

However, the digital blocks present in designs today can suffer from large power consumption as a consequence of the unipolar nature of some thin-film transistor technologies, such as metal-oxides or organics. Providing circuits with lower power consumption can enhance battery life for mobile devices and displays and enable increased complexity of RFID tags, etc.

One reason for the current high power consumption is the absence of complementary thin-film devices. The extra layer masks needed for producing complementary devices increase the manufacturing cost of the circuits. In addition, some technologies lack matching complementary alternatives of the semiconductor limiting the realization of complementary logic. One focus in the field is to find alternative circuit configurations based on unipolar technologies, mainly focusing on increased robustness and speed compared to diode-load or zero-$V_{GS}$-load logic.

T. C. Huang et al., "Pseudo-CMOS: A Design Style for Low-Cost and Robust Flexible Electronics", IEEE Transactions on Electron Devices, vol. 58, no. 1, pp. 141-150, January 2011 discloses the use of pseudo CMOS. This topology provides improved robustness and speed and is implemented with four TFTs to realize an inverter compared to a regular 2-TFT inverter. The drawbacks are still a high power consumption and the necessity to have two supply voltages and a ground connection ($V_{DD}$ and $V_{BIAS}$ or $V_{SS}$).

K. Myny et al., "Robust digital design in organic electronics by dual-gate technology", 2010 IEEE International Solid-State Circuits Conference—(ISSCC), San Francisco, Calif., 2010, pp. 140-141 discloses to improve diode-load logic by adding a backgate to increase its robustness. Dual-gate diode-load logic reduces chip area compared to pseudo-CMOS logic, but the power consumption is still large due to the on-state of the load transistor when outputting a logic zero.

J. S. Kim et al., "Dynamic Logic Circuits Using a-IGZO TFTs," IEEE Transactions on Electron Devices, vol. 64, no. 10, pp. 4123-4130, October 2017 discloses the use of dynamic logic, which increases the speed and reduces size, but at the cost of high sensitivity to threshold voltage and timing, and requiring complex clock distribution systems.

M. Venturelli et al., "Unipolar Differential Logic for Large-Scale Integration of Flexible aIGZO Circuits", IEEE Transactions on Circuits and Systems II: Express Briefs, vol. 64, no. 5, pp. 565-569, May 2017 discloses the use of differential logic for high static noise margin, but at the cost of no less than eight transistors per inverter, and as such chip area.

N. P. Papadopoulos et al., "Low-Power Bootstrapped Rail-to-Rail Logic Gates for Thin-Film Applications," Journal of Display Technology, vol. 12, no. 12, pp. 1539-1546, December 2016 discloses a bootstrapped inverter with low power consumption, but this topology also uses five transistors per inverter.

SUMMARY

The present disclosure is generally related to a circuit topology for thin-film unipolar circuits that can combine the high-speed performance of diode load logic and the low power consumption of zero-$V_{GS}$ logic during operation.

In view of the above, a potential benefit of the disclosure is to provide an alternative circuit topology which provides a reduction in power consumption while still providing a high operational speed. A further potential benefit of the disclosure is to provide a logic circuit which avoids multiple current branches between $V_{DD}$ and ground.

According to a first aspect of the present disclosure, there is provided a logic circuit. The logic circuit comprises a first thin film transistor, TFT, having a gate connected to an input of the logic circuit, and a drain connected to an output of the logic circuit. The logic circuit further comprises a second TFT having a source connected to the output of the logic circuit. The logic circuit further comprises a third TFT having a gate connected to the input of the logic circuit, a source connected to the source of the second TFT, and a drain connected to a gate of the second TFT. The logic circuit further comprises a fourth TFT having a gate connected to the output of the logic circuit, and a source connected to the gate of the second TFT and the drain of the third TFT.

The present disclosure is based on providing an alternative topology, referred to as crossover logic in the following, for digital blocks, which can provide a significant reduction in power consumption while still maintaining a fairly high operational speed. Since speed is of importance in most systems, crossover logic can be used in combination with diode load logic or pseudo-CMOS logic and can especially be used in sections that are not critical with respect to speed, thereby reducing the overall power consumption of a system without sacrificing operational speed.

Thus, a potential advantage of the present disclosure is that the topology of the logic circuit can combine the advantages of diode load logic and zero-$V_{GS}$ logic in real time during operation by crossing over from the high-speed operation of diode load logic to the low-power operation of zero-$V_{GS}$ logic as the input signal varies. A further potential advantage is that the combination of low power consumption and high speed is achieved by a logic circuit of lower complexity.

The present disclosure relates to a logic circuit. Herein, the term logic circuit can refer to substantially any electronic circuit used to perform a logical operation on one or more input signals. The logic circuit may include an "AND," "NOT" (inverter), "NAND," "OR," "NOR," or "XOR" gate, which can also be combined into more complex circuits. The logic circuit can hence have one or more inputs and one or more outputs depending on the operation the circuit is to perform.

The logic circuit comprises thin film transistors that may be implemented using any thin-film technology which has devices available with both positive and negative threshold voltages, e.g., devices implemented using amorphous silicon, organic semiconductors, oxide semiconductors, or low-temperature poly-silicon (LTPS). The threshold voltages can be controlled by means of intrinsic device properties (e.g., doping, choice of semiconductor, length of the channel, etc.) or by means of a second gate (backgate) to control the channel properties.

In the following, the terms "source," "drain," and "gate" generally have their normal meaning within the technical field, i.e. the source of the TFT is the terminal through which the carriers enter the channel, the drain is the terminal through which the carriers leave the channel, and the gate is the terminal that modulates the channel conductivity.

According to an embodiment of the present disclosure, the first TFT has a source connected to a first power supply rail.

A potential advantage of this embodiment is that the source of the first TFT may act as a connection point between the supply rail and the rest of the logic circuit for enabling current to flow through the logic circuit. Thus, the current flowing through the logic circuit during operation may be controlled by controlling the state of the first TFT thereby reducing the overall power consumption of the logic circuit.

The term "supply rail" herein generally refers to any electrical conductor (such as a wire, a trace on a circuit board or chip, or similar) which is capable of providing the logic circuit with a defined positive or negative potential, such as −12 V, −5 V, −3 V, 0 V (ground), 3 V, 5 V, or 12 V, in order to provide power for operation of the logic circuit. Supply rails in this technical field are normally named $V_{DD}$ (positive), $V_{SS}$ (negative), GND, $V_{CC}$ (positive) and $V_{EE}$ (negative).

According to an embodiment of the present disclosure, the second and fourth TFTs each have a drain connected to a second power supply rail.

A potential advantage of this embodiment is that the second and fourth TFTs may provide a strong pull-up when the output is high due to the gate of the second TFT basically being connected to the supply rail via the channel of the fourth TFT, thereby causing the logic circuitry to operate as high speed diode load logic.

According to an embodiment of the present disclosure, the first power rail is ground and the second power rail is a positive supply voltage.

A potential advantage of this embodiment is that the problems related to pseudo CMOS, which generally requires two supply voltages ($V_{DD}$ and $V_{SS}$, $V_{BIAS}$, $V_{DD2}$, etc.) in addition to a ground connection, are generally mitigated.

According to an embodiment of the present disclosure, the first TFT has a threshold voltage, $V_{T1}$, which is greater than a threshold voltage, $V_{T2}$, of the second TFT.

A potential advantage of this embodiment is that the leakage current of the first TFT is low when the signal at the input is low, and that the second TFT may conduct enough current such that a transition from low-to-high at the output is facilitated when the signal at the input transitions from high-to-low.

The term "threshold voltage" herein generally refers to the gate-to-source voltage that is needed to create a conducting path between the source and drain terminals of the TFTs.

In the following, the terms "high" and "low" signal generally have their normal meaning within the technical field, i.e. the two logical states representing a binary one and a binary zero. The high and low signals are usually represented by two different voltages (may also be currents). In order to distinguish between a high signal and a low signal, high and low thresholds are specified. When the signal is below the low threshold, the signal is "low" and when above the high threshold, the signal is "high." By way of example, the binary logic input levels for CMOS is typically 0 V to ⅓ $V_{DD}$ for "low" and ⅔ $V_{DD}$ to $V_{DD}$ for "high" where $V_{DD}$ is the supply voltage. The corresponding typical levels for TTL are 0 V to 0.8 V for "low" and 2 V to $V_{CC}$ for "high," where $V_{CC}$ is 5 V. Unipolar logic, such as n-type only IGZO logic, yields typically asymmetric transfer curves resulting in an asymmetric division of typical levels.

According to an embodiment of the present disclosure, the second TFT is a depletion mode transistor.

The term "depletion mode transistor" generally refers to a transistor that is able to conduct a current when its gate-to-source voltage is zero volts.

A potential advantage of this embodiment is that the second TFT is generally able to conduct a current when its gate-to-source voltage is zero such that a transition from low-to-high at the output of the logic circuit is facilitated when the signal at the input of the logic circuit transitions from high-to-low.

According to an embodiment of the present disclosure, the first TFT is an enhancement mode transistor.

The term "enhancement mode transistor" herein generally refers to a transistor that is off (i.e. not conducting any current, or a very low leakage current) when its gate-to-source voltage is zero.

A potential advantage of this embodiment is that it is ensured that there is no substantial conducting path between the source and drain terminals of the first TFT when the signal at the input is low (only a leakage current may be present). The static power consumption of the logic circuit is thereby greatly reduced.

According to an embodiment of the present disclosure, one or more of the first, second, third, and fourth TFTs comprises a backgate.

A potential advantage of this embodiment is that the robustness of the logic circuit may be increased, providing a noise margin that is sufficiently high to ensure stable characteristics, since the threshold voltage $V_T$ of any of the TFTs may be adjusted by applying a voltage to the backgate. The backgate voltage can be an external voltage or it can be an "internal" voltage, i.e. the backgate can be connected to an internal node of the logic circuit, such as an output node of the logic circuit.

The term "backgate" herein generally refers to a fourth contact that can influence the electric field in the TFT. This may, e.g., be done by depositing an extra insulation layer and a metal layer on top of the TFT. A backgate is sometimes referred to as a top-gate or a bottom-gate, as a function of the device cross-section. The threshold voltage $V_T$ of a TFT is shifted as a result of applying a voltage to the backgate with respect to the source, i.e. the threshold voltage $V_T$ is generally a linear function of the source-backgate voltage.

According to an embodiment of the present disclosure, the logic circuit comprises a first adjustment input for receiving an adjustment signal to the backgate of the first TFT.

A potential advantage of this embodiment is that the threshold voltage of the first TFT may easily be adjusted after manufacturing of the logic circuit, thereby facilitating reliable operation of the first TFT in enhancement mode which in turn provides low leakage current through the TFT when signal at the input is low.

The term "adjustment input" herein generally refers to any electrical conductor (such as a wire, a trace on a circuit board or chip, or similar) that is connected to the backgate of the TFT.

According to an embodiment of the present disclosure, the logic circuit comprises a second adjustment input for receiving an adjustment signal to the backgate of the second TFT.

A potential advantage of this embodiment is that the threshold voltage of the second TFT may easily be adjusted after manufacturing of the logic circuit, thereby controlling the operation of the second TFT in depletion mode such that the second TFT conducts a current when its gate-to-source voltage is zero. Thus, by controlling the current flowing through the second TFT when its gate-to-source voltage is zero, a transition from low-to-high at the output of the logic circuit is facilitated when the signal at the input of the logic circuit transitions from high-to-low.

According to an embodiment of the present disclosure, the first TFT is adapted to turn on in response to receiving a logic high signal at its input and turn off in response to receiving a logic low signal at its input.

A potential advantage of this embodiment is that the first TFT will provide a strong pull-down of the output when the input signal is high and provide a very low static power consumption when the input signal is low.

The term "turn on" herein generally means that the gate-source voltage of the TFT is higher than the threshold voltage, thereby creating a conductive channel between the source and the drain of the TFT, i.e., the TFT is active and conducts a current between the source and drain. Conversely, the term "turn off" herein generally means that the gate-source voltage of the TFT is lower than the threshold voltage, thereby impeding the creation of a conductive channel between the source and the drain of the TFT, i.e., the TFT is inactive and does not conduct a current between the source and drain except for a possible small leakage current.

According to an embodiment of the present disclosure, the fourth TFT is adapted to provide feedback from the output of the logic circuit to the gate of the second TFT.

A potential advantage of this embodiment is that a very strong pull-up is provided by the second and fourth TFTs when the output signal is high, thereby providing the high speed of diode load logic. In other words, a positive feedback is provided from the output of the logic circuit to the combination of the fourth and second TFTs, thereby ensuring that the second TFT is fully conducting when the output is high.

According to an embodiment of the present disclosure, the third TFT is adapted to turn off the second TFT in response to receiving a logic high input signal at its input.

A potential advantage of this embodiment is that the third TFT causes the logic circuit as a whole to operate in zero-$V_{GS}$ logic mode when the input signal is high. The turn off of the second TFT reduces the current flowing through the second TFT (only a small zero-$V_{GS}$ current is present) wherein the power consumption of the logic circuit is greatly reduced.

According to an embodiment of the present disclosure, the first TFT is connected such that all current flowing through the logic circuit, when in use, from the second supply rail to the first supply rail flows through the first TFT.

A potential advantage of this embodiment is that the overall power consumption is lowered since current flows from the second supply rail to the first supply rail only when the first TFT is active. Some devices comprise multiple independent current paths between the supply rails (e.g. for biasing purposes), thereby increasing the static power consumption.

According to a second aspect of the disclosure, there is provided a logic circuit comprising a pull-down circuit having an input connected to an input of the logic circuit and an output connected to an output of the logic circuit. The pull-down circuit is adapted to turn on (i.e. be activated) in response to receiving a positive high input signal at its input and turn off (i.e. be deactivated) in response to receiving a logic low signal at its input. The logic circuit comprises a pull-up circuit having an output connected to the output of the logic circuit. The logic circuit comprises a feedback circuit providing positive feedback from the output of the logic circuit to an input of the pull-up circuit. The logic circuit comprises an input circuit having an input connected to the input of the logic circuit and being adapted to turn off (i.e. deactivate) the pull-up circuit in response to receiving a logic high input signal at its input.

BRIEF DESCRIPTION OF THE FIGURES

The above, as well as additional, features will be better understood through the following illustrative and non-limiting detailed description of example embodiments, with reference to the appended drawings.

All the figures are schematic, not necessarily to scale, and generally only show parts which are necessary to elucidate example embodiments, wherein other parts may be omitted or merely suggested.

DETAILED DESCRIPTION

Example embodiments will now be described more fully hereinafter with reference to the accompanying drawings. That which is encompassed by the claims may, however, be embodied in many different forms and should not be construed as limited to the embodiments set forth herein; rather, these embodiments are provided by way of example. Furthermore, like numbers refer to the same or similar elements or components throughout.

Figure 1:
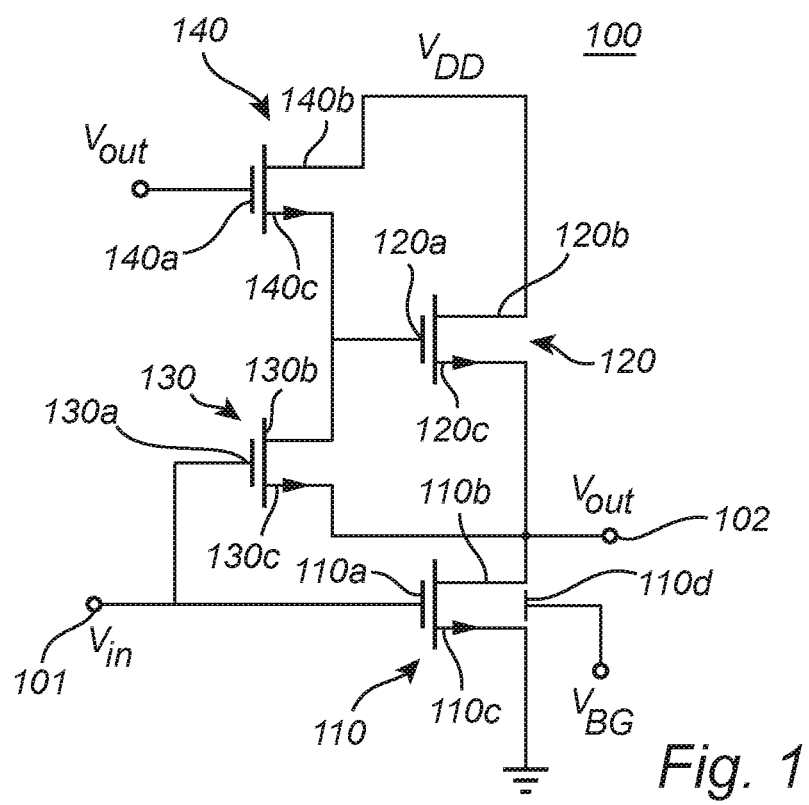
FIG. 1 is a schematic diagram of a logic circuit, according to an example embodiment.

FIG. 1 illustrates a logic circuit 100 according to an embodiment of the present disclosure. The logic circuit 100 comprises a first thin film transistor (TFT) 110 which has a gate 110a connected to an input 101 of the logic circuit, and a drain 110b connected to an output 102 of the logic circuit 100. The first TFT may be referred to as a drive transistor. The logic circuit 100 comprises a second TFT 120 which has a source 120c connected to the output 102 of the logic circuit 100. The second TFT may be referred to as a load transistor. The logic circuit comprises a third TFT 130 which has a gate 130a connected to the input 101 of the logic circuit 100, a source 130c connected to the source 120c of the second TFT 120, and a drain 130b connected to a gate 120a of the second TFT 120. The logic circuit comprises a fourth TFT 140 which has a gate 140a connected to the output 102 of the logic circuit 100, and a source 140c connected to the gate 120a of the second TFT 120 and the drain 130b of the third TFT 130.

The first TFT 110 has a source 110c which is connected to a first power supply rail which according to an embodiment is ground, i.e. a zero-volt potential (alternatively, the source of the first TFT 110 is connected to $V_{DD}$ should the logic circuit 100 be implemented by means of p-type TFTs instead of n-type TFTs as illustrated in FIG. 1). The second TFT 120 has a drain 120b and the fourth TFT 140 has a drain 140b which are connected to a second power supply rail, which according to an embodiment is a positive supply voltage $V_{DD}$, such as 3 V, 5 V or 12 V in order to provide power for operation of the logic circuit.

The present disclosure implements the logic circuit according to a circuit topology which can be referred to as crossover logic since it can combine the advantages of diode load logic and zero-$V_{GS}$ logic in real time. Diode load logic typically uses a diode-connected transistor as a load for the drive transistor. In diode load logic topology, the gate and the drain of the load transistor are shorted. If the sizes of the load and drive transistor are properly selected, a logic circuit with small delay and high speed can be achieved. However, due to the relatively high static current flowing through the load transistor, the static power consumption of diode load logic is high. In zero-$V_{GS}$-load logic, the gate and source of the load transistor are shorted. Therefore, the load transistor acts as a current source at a constant $V_{GS}$ voltage of zero volts. In comparison with diode load logic, the static current flowing through the load transistor is much smaller (typical >2 order of magnitude) which, at the cost of a slower operational speed, provides a logic circuit with lower power consumption.

Figure 2A:
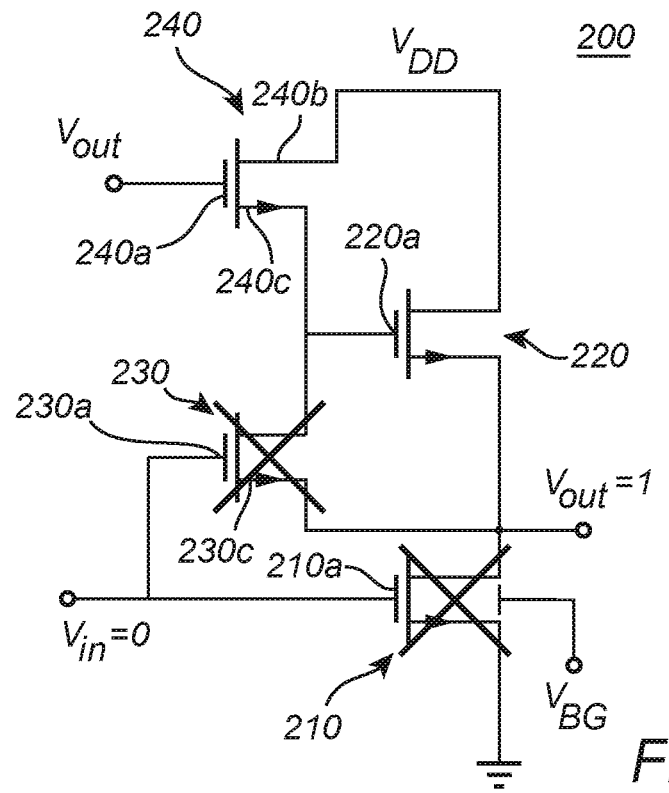
FIG. 2a is a schematic diagram of a logic circuit operating in diode logic load mode, according to an example embodiment.
Figure 2B:
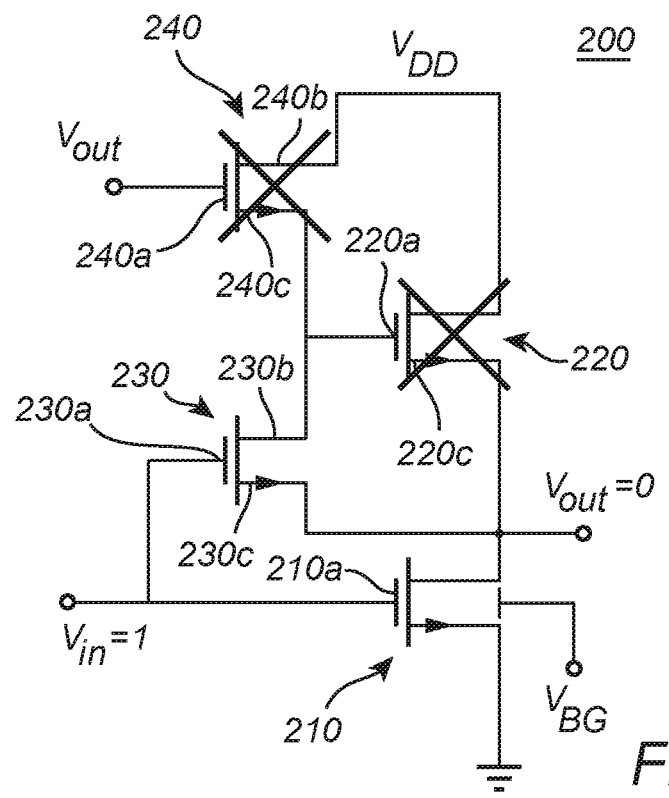
FIG. 2b is a schematic diagram of a logic circuit operating in zero-$V_{GS}$ mode, according to an example embodiment.

The operation mechanism of the logic circuit according to the present disclosure crosses over from the high-speed operation of diode load logic to the low-power operation of zero-$V_{GS}$ load logic in response to the signal received at its input. With reference to FIGS. 2a and 2b, the operation of the logic circuit as an inverter will be described for a logical low input signal and a logical high input signal, respectively.

When the input is a logical low signal (as indicated by $V_{in}$=0), as seen in FIG. 2a, the logic circuit 200 operates like diode load logic. Due to the logical low input signal at the gate 210a and the gate 230a, the first transistor 210 and third transistor 230 are inactive (as indicated by being crossed-out in FIG. 2a) save a possible small leakage current, and the output is pulled high by the second transistor 220 (the load transistor). The static power consumption is determined by the leakage current of the first transistor 210. Therefore, the first transistor 210 can be designed with a high (positive) threshold voltage $V_T$, which results in a very small static power consumption of the logic circuit 200. Since the output signal is fed back to the second transistor 220 via the fourth transistor 240, the pull-up is strong and the speed is high, because the gate 220a of the second transistor 220 is connected to the positive power supply via the low-impedance channel of the fourth transistor 240, which is active.

When the input is a logical high signal (as indicated by $V_{in}$=1), as seen in FIG. 2b, the logic circuit 200 operates like zero-$V_{GS}$ logic. The first transistor 210 (the drive transistor) receives the high input signal at the gate 210a and is hence active, which provides a strong pull down resulting in high speed, thereby generating a logical low signal at the output of the logic circuit 200. The logical high input signal is also provided to the gate 230a of the third transistor 230, which renders the third transistor 230 active thereby providing a low-impedance path between the drain 230b and the source 230c. The gate 220a of the second transistor 220 (acting as load) is hence connected to the source 220c via the third transistor 230, which renders the second transistor 220 inactive in the sense that only a small zero-$V_{GS}$ current, depending on the threshold voltage $V_T$, is flowing through the transistor (as indicated by being crossed-out in FIG. 2b). The second transistor 220 acts as a high-impedance block between the supply rail and the drain 210b of the first transistor 210. The fourth transistor 240 receives the logical low output signal at its gate 240a and is hence inactive (as indicated by being crossed-out in FIG. 2b). The fourth transistor 240 acts as a high-impedance block between the supply rail and the drain 230b of the third transistor 230, thereby preventing a current from flowing from the positive rail via the fourth, third, and first transistors to ground. Since the pull-down by the first transistor 210 is very strong, the power consumption is determined by the small zero-$V_{GS}$ leakage current of the second transistor 220. Thus, the static power consumption of the logic circuit 200 is very small.

As can be understood from the discussion above, a benefit of the crossover logic is that all current flowing through the logic circuit flows through the first transistor 210. There are hence no separate branches (for biasing purposes) allowing current to flow from the positive supply rail to ground. This will effectively reduce the static power consumption since the current through the circuit is basically cut off when the input receives a logical low signal rendering the first transistor inactive (except for a possible small leakage current flowing through the first transistor 210). Likewise, due to the feedback from the output to the fourth transistor 240, and the connection of the third transistor 230, the current flowing through the logic circuit is basically cut off when the input receives a logical high signal (except for a small zero-$V_{GS}$ current flowing through the second transistor 220).

Switching between diode load and zero-$V_{GS}$ load is done by a resistive divider made by the third transistor 230 and the fourth transistor 240. When the input is a logical low signal as seen in FIG. 2a, the output is a logical high signal, and the fourth transistor 240 is rendered active via the feedback from the output to the gate 240a of the fourth transistor 240. The third transistor 230 receives the logical low input signal at its gate 230a and is inactive. Seen as a resistive divider, the third transistor 230, which is inactive, presents an impedance between its drain 230b and source 230c that is much higher than the impedance seen between the drain 240b and source 240c of the fourth transistor 240, which is active. Thus, the gate 220a of the second transistor 220 is virtually connected to the supply through the fourth transistor 240 while the third transistor 230 is inactive and does not pull down the gate potential at the second transistor 220.

When the input is a logical high signal as seen in FIG. 2b, the output is a logical low signal, and the fourth transistor 240 is rendered inactive via the feedback from the output to the gate 240a of the fourth transistor 240. The third transistor 230 receives the logical high input signal at its gate 230a and is active. Seen as a resistive divider, the third transistor 230, which is active, presents an impedance between its drain 230b and source 230c that is much lower than the impedance seen between the drain 240b and source 240c of the fourth transistor 240, which is inactive. Thus, the gate 220a of the second transistor 220 is virtually connected to the source 220c of the second transistor (and the output) through the third transistor 230, enabling zero-$V_{GS}$ operation, while the fourth transistor 240 is inactive and does not pull up the gate potential at the second transistor 220.

When the input signal changes from a logical high signal to a logical low signal (i.e., from 1 to 0) the output is initially at a logical low signal level which is fed back to the gate 240a of the fourth transistor 240, rendering it inactive. This means that the second transistor 220 is in high-impedance mode (zero-$V_{GS}$ mode) since the fourth transistor 240 is not able to increase the gate-source voltage, $V_{GS}$, of the second transistor 220. In order for the logical circuit 200 to switch states, a leakage current through the second transistor 220 has to recharge the output until the feedback flips the operation mode of the second transistor 220 (i.e. from zero-$V_{GS}$-load to diode load). Therefore, there is a trade-off between speed and power consumption, set by the leakage current of the second transistor 220, which is set by its threshold voltage $V_T$. A higher off-current can recharge the output node more rapidly, but also leaks more when the input is high, thereby increasing the static power consumption.

The fourth transistor 240 and the third transistor 230 can be minimized to gain area, since they generally only need to charge the gate capacitance of the second transistor 220.

In conclusion, a new topology for thin-film technology with low power consumption, crossover logic, has been disclosed. The topology uses elements from diode load logic and zero-$V_{GS}$ logic, to combine the speed of diode load logic with the low static power properties of zero-$V_{GS}$ logic. By way of example, with respect to diode load logic with backgate, the static noise margin has been measured to increase from 0.475 V to 1.572 V for a 5V supply. Additionally, the power consumption has been measured to be reduced by a factor 5, while the decrease in speed is limited to a factor of 2.1. The new logic style is also fully compatible with diode load logic.

While some embodiments have been illustrated and described in detail in the appended drawings and the foregoing description, such illustration and description are to be considered illustrative and not restrictive. Other variations to the disclosed embodiments can be understood and effected in practicing the claims, from a study of the drawings, the disclosure, and the appended claims. The mere fact that certain measures or features are recited in mutually different dependent claims does not indicate that a combination of these measures or features cannot be used. Any reference signs in the claims should not be construed as limiting the scope.

What is claimed is:

1. A logic circuit comprising:
   a first thin film transistor (TFT) having a first drain, a first gate, and a first source;
   a second TFT having a second drain, a second gate, and a second source;
   a third TFT having a third drain, a third gate, and a third source; and
   a fourth TFT having a fourth drain, a fourth gate, and a fourth source,
   wherein the second source, the fourth gate, the third source, and the first drain form a first node,
   wherein the fourth drain and the second drain form a second node,
   wherein the fourth source, the second gate, and the third drain form a third node, and
   wherein the third gate and the first gate form a fourth node.

2. The logic circuit according to claim 1, wherein the first source forms a fifth node with a first power supply.

3. The logic circuit according to claim 2, wherein a second power supply additionally forms the second node with the fourth drain and the second drain.

4. The logic circuit according to claim 3, wherein the first TFT is the only current path from the second power supply to the first power supply through the logic circuit.

5. The logic circuit according to claim 3, wherein the first power supply is ground and the second power supply is a positive supply voltage.

6. The logic circuit according to claim 1, wherein the first TFT has a first threshold voltage that is greater than a second threshold voltage of the second TFT.

7. The logic circuit according to claim 1, wherein the second TFT is a depletion mode transistor.

8. The logic circuit according to claim 1, wherein the first TFT is an enhancement mode transistor.

9. The logic circuit according to claim 1, wherein one or more of the first TFT, the second TFT, the third TFT, or the fourth TFT comprises a backgate.

10. The logic circuit according to claim 1, the first TFT comprising a backgate and being configured to receive an adjustment signal at the backgate.

11. The logic circuit according to claim 1, the second TFT comprising a backgate and being configured to receive an adjustment signal at the backgate.

12. The logic circuit according to claim 1, wherein the first TFT is adapted to turn on in response to receiving a logic high signal at the first gate and to turn off in response to receiving a logic low signal at the first gate.

13. The logic circuit according to claim 1, wherein the fourth TFT is adapted to provide feedback from the first node to the third node.

14. The logic circuit according to claim 1, wherein the third TFT is adapted to turn off the second TFT in response to receiving a logic high input signal at the third gate.

15. A method of operating the logic circuit of claim 1, the method comprising:
    providing an input signal to the fourth node; and
    transitioning the input signal from logic high to logic low, thereby turning on the second TFT and the fourth TFT and turning off the first TFT and the third TFT.

16. The method of claim 15, wherein transitioning the input signal from logic high to logic low comprises transitioning the input signal from logic high to logic low, thereby causing the first node to transition from logic low to logic high.

17. The method claim 15, further comprising providing a supply voltage between the first source and the second drain.

18. A method of operating the logic circuit of claim 1, the method comprising:
    providing an input signal to the fourth node; and
    transitioning the input signal from logic low to logic high, thereby turning off the second TFT and the fourth TFT and turning on the first TFT and the third TFT.

19. The method of claim 18, wherein transitioning the input signal from logic low to logic high comprises transitioning the input signal from logic low to logic high, thereby causing the first node to transition from logic high to logic low.

20. The method claim 18, further comprising providing a supply voltage between the first source and the second drain.

* * * * *